(12) United States Patent
Nanjundaiah et al.

(10) Patent No.: US 12,013,422 B2
(45) Date of Patent: Jun. 18, 2024

(54) LOOSE WIRE DETECTION BASED ON METROLOGY DATA

(71) Applicant: Itron, Inc., Liberty Lake, WA (US)

(72) Inventors: Arunkumar Nanjundaiah, Bengaluru (IN); Linto Vadakkan Johny, Bengaluru (IN); Santhosh Palethadka, Bengaluru (IN); Dinkar Kumar Verma, Bengaluru (IN)

(73) Assignee: Itron, Inc., Liberty Lake, WA (US)

( * ) Notice: Subject to any disclaimer, the term of this patent is extended or adjusted under 35 U.S.C. 154(b) by 93 days.

(21) Appl. No.: 17/403,746

(22) Filed: Aug. 16, 2021

(65) Prior Publication Data
US 2023/0048261 A1 Feb. 16, 2023

(51) Int. Cl.
*G01R 22/06* (2006.01)
*G01R 31/54* (2020.01)
*G01R 31/55* (2020.01)
*G01R 31/58* (2020.01)

(52) U.S. Cl.
CPC ......... *G01R 22/068* (2013.01); *G01R 22/063* (2013.01); *G01R 31/54* (2020.01); *G01R 31/55* (2020.01); *G01R 31/58* (2020.01)

(58) Field of Classification Search
None
See application file for complete search history.

(56) References Cited

U.S. PATENT DOCUMENTS

| 9,897,640 | B2 | 2/2018 | Chen et al. | |
| 10,488,466 | B2 | 11/2019 | Parkin | |
| 10,944,219 | B2 | 3/2021 | AbuGhazaleh et al. | |
| 10,969,775 | B2 | 4/2021 | Khalate et al. | |
| 2006/0119368 | A1* | 6/2006 | Sela | H02H 7/263 324/522 |
| 2019/0079132 | A1* | 3/2019 | Chine | G01R 31/1272 |
| 2020/0173810 | A1* | 6/2020 | Verma | G01D 4/004 |

FOREIGN PATENT DOCUMENTS

CN 112234711 1/2021

\* cited by examiner

*Primary Examiner* — Son T Le
*Assistant Examiner* — Brian Butler Geiss
(74) *Attorney, Agent, or Firm* — Lee & Hayes, P.C.

(57) ABSTRACT

Techniques for determining a potential electrical threat by a utility meter are described herein. A metrology unit of the meter is configured to receive electrical data associated with electrical usage at a location The meter is configured to determine, based on the electrical usage at the location and/or previous electrical data, abnormalities indicative of an unstable connection, such as a loose wire connecting a load to a power supply. The meter may employ a machine learned model or other algorithm to identify the loose wire or unstable connection and is configured to disconnect power to the location and/or send a message to an alarm device at the location and/or to a computing device remote from the location. In this way, the metrology unit can be used to mitigate potential electrical threats, such as fire, due to an unstable connection such as a loose connection.

18 Claims, 6 Drawing Sheets

LOOSE WIRE DETECTION BASED ON METROLOGY DATA

BACKGROUND

Meters at different customer locations can be used to measure electrical usage provided by a utility. Meters typically measure an amount of power used by various loads at each customer location. The customer location may include a circuit breaker to protect the premises from an electrical surge by disconnecting an electrical power supply associated with the electrical surge. However, electrical damage, such as fire, may occur due to faulty wiring that does not cause the circuit breaker to activate.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features. Moreover, the figures are intended to illustrate general concepts, and not to indicate required and/or necessary elements.

DETAILED DESCRIPTION

Overview

Figure 1:
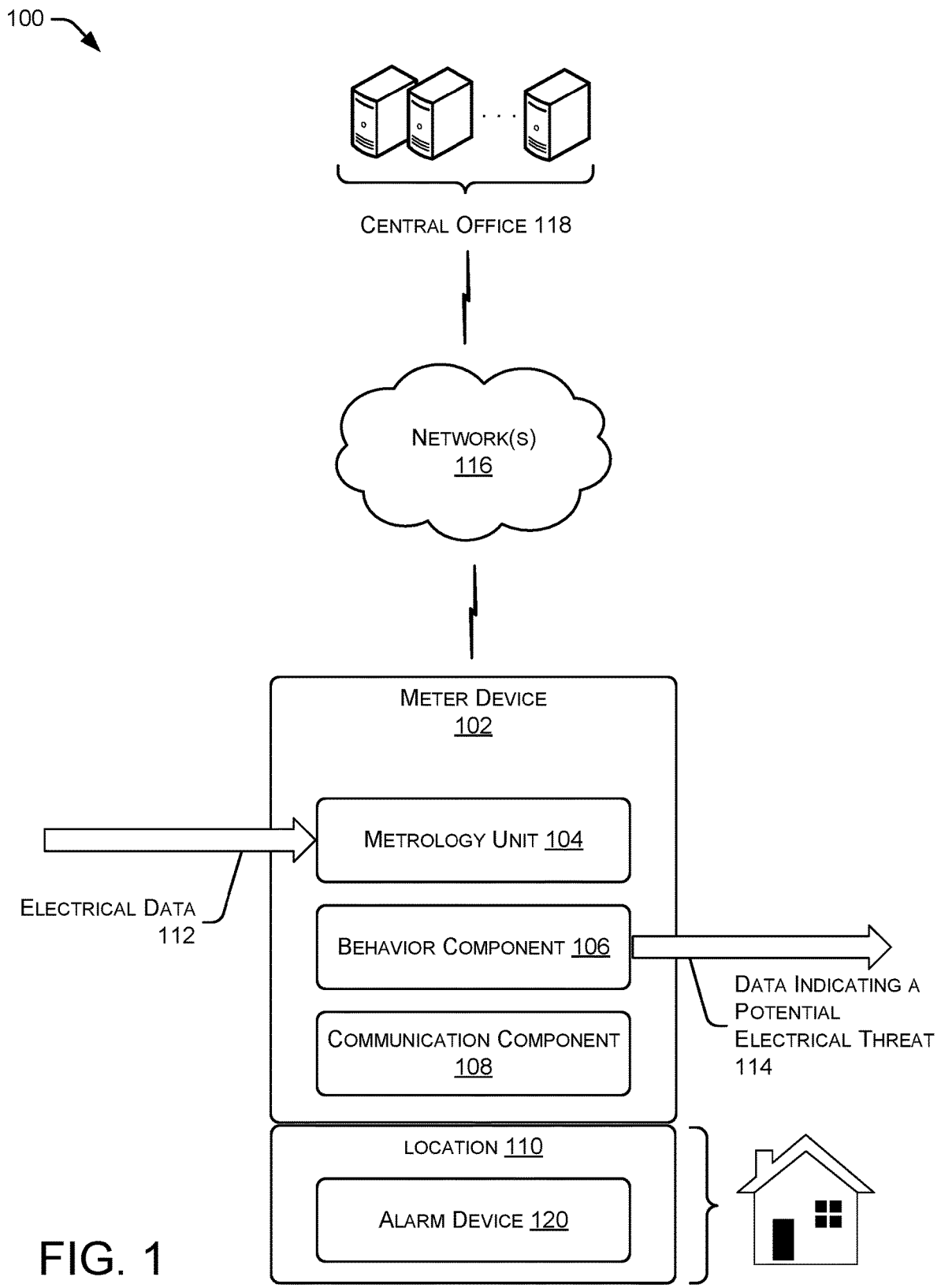
FIG. 1 is a block diagram showing an example environment in which an example meter device determines a potential electrical threat.

The disclosure describes techniques for processing electrical data at a meter device to determine a potential electrical threat. For example, the meter device may receive electrical data from one or more sensors representing electrical consumption over a time period and analyze the electrical data to identify a pattern of electrical usage. In some examples, the meter device can compare the pattern of electrical usage to a previous pattern(s) of electrical usage associated with the earlier time period to identify whether a load at a location coupled to the meter device experiences a spark, a surge, or other electrical threat that can cause a fire or electrical failure. By way of example and not limitation, a behavior component of the meter device can process electrical data associated with a location, such as a residence or a business receiving electrical power from a utility provider, and identify behavior associated with a loose wire or loose connection to an electrical power supply within the location. In such examples, the meter device can determine whether to send a message (e.g., an alarm signal) to an application, to an alarm device at the location, and/or to a computing device associated with the utility provider. In this way, the meter device can provide functionality to prevent a fire or electrical failure caused by a loose connection that is otherwise undetectable.

In some examples, the meter device may implement one or more machine learning algorithms to determine changes in electrical data indicative of a potential electrical threat (e.g., a loose or insecure connection to a power supply). For instance, the meter device may implement a machine learned model that is trained to identify changes in electrical usage patterns over time and, in particular identify an electrical usage pattern that represents intermittent power disruptions associated with a loose wire connection. By identifying an electrical threat associated with the loose wire connection at the meter device, an alarm signal can be generated for communication to a customer directly and without requiring using a network to first notify a utility provider thereby saving time and network resources.

The techniques described herein can include a system that includes logic, algorithms, models, and the like to differentiate between behavior associated with safe operation of an electrical load and behavior that is indicative of a potential electrical threat. For instance, the meter device can implement an algorithm and/or model that can distinguish fluctuations in electrical usage due to normal operating conditions such as loads turning on and off (e.g., a user flicking the light switch on and off, or possibly holiday lights flashing) from other fluctuations in electrical usage due to a loose or insecure connection to a power supply.

The techniques described herein can be implemented in a number of ways. Example implementations are provided below with reference to the following figures. Although discussed in the context of a utility service provider, the methods, apparatuses, and systems described herein can be applied to a variety of systems and is not limited to utility systems. In another example, the techniques can be utilized in an electrical vehicle context, or in any system using sensor data. When the techniques are applied in the electric vehicle context, a charging station can be configured to identify a potential electrical threat associated with one or more batteries or other electrical devices of the electric vehicle.

Example Systems and Techniques

FIG. 1 is a block diagram showing an example environment 100 in which an example meter device (meter device 102) determines a potential electrical threat. As shown in FIG. 1, the meter device 102 includes a metrology unit 104, a behavior component 106, and a communication component 108, and is shown coupled to a location 110 (e.g., a residence, a business, or other location that receives electrical service from a utility provider). Generally, the meter device 102 can represent a smart utility meter or similar device used by a company to collect, aggregate, and/or manage electrical consumption of an electrical device (e.g., load) coupled to the meter device.

In various examples, the metrology unit 104 can receive electrical data 112 from one or more sensors over a time period and communicate the electrical data 112 to the behavior component 106 for processing. For instance, the metrology unit 104 may be configured to measure electrical power consumed at the location 110 by a utility customer. The metrology unit 104 can receive the electrical data 112 (e.g., resistive data, capacitance data, current data, voltage data, power data, etc.) as input that represents patterns of electrical usage over time period. In some examples electrical data 112 may be associated with specific loads (e.g., an appliance, a dimmer switch, an electrical outlet, and so on)

that consume power within the location 110. In this way, the electrical data 112 may be representative of a resistive load, capacitive load, and/or an inductive load.

In some examples, the behavior component 106 can process the electrical data 112 to generate, output, or otherwise determine data indicating a potential electrical threat 114. In some examples, the behavior component 106 can implement statistical, mathematical, and/or machine learned algorithms to determine whether the electrical data 112 is associated with a loose connection to a power supply within the location 110. Generally, the behavior component 106 can identify the loose connection by detecting, identifying, or otherwise determining one or more electrical behavioral patterns in the electrical data 112. In some examples, the behavior component 106 can implement a machine learned model that is trained to identify patterns associated with an electrical threat at the location 110. The behavior component 106 can, in some examples, identify an area within the location 110 at which the loose wire is located.

In some examples, the electrical data 112 can represent data associated with a frequency domain, harmonics, and the like. In such examples, the behavior component 106 can act as a discriminator to identify frequencies of a load that represent a potential electrical threat. For instance, the behavior component 106 can implement a machine learned model that is trained to identify patterns in one or more frequencies and/or harmonics that are associated with the potential electrical threat (e.g., identify an anomaly, or change, in the electrical data 112 over time, compare a pattern in the electrical data 112 to known patterns representing an electrical threat, and so on).

Upon the behavior component 106 detecting a potential electrical threat, additional electrical data associated with different time periods can be received by the metrology unit 104 to iteratively determine whether the potential electrical threat should be reported (while in other examples the potential electrical threat can be reported directly without receiving additional electrical data). In examples when the behavior component 106 determines that the potential electrical threat (e.g., a risk of fire due to the loose connection, rise in temperature at a connection point over a time period, etc.) exists, the communication component 108 can generate an alarm signal indicating the potential electrical threat for sending, over the network(s) 116 to a central office 118 associated with the utility provider and/or to an alarm device 120 associated with the location 110. In such examples, the central office 118 may represent a headend device such as a server that manages electrical consumption at the location 110. In some examples, the alarm signal may further indicate the area within the location 110 at which the loose connection is located.

In various examples, the behavior component 106 can make an initial determination about a potential electrical threat, and send data (e.g., electrical data associated with one or more time periods) to the central office 118, and receive a confirmation or verification from the central office 118 validating or overriding the initial determination by the meter device 102. For instance, the remote computing device may implement more sophisticated/powerful algorithms (than those implemented by the meter device 102) and/or utilize more information about the grid (e.g., power surges, voltage fluctuations, data from other nearby meters and/or transformers, etc.) to either confirm or override the meter's determination.

The communication component 108 can provide functionality to enable the meter device 102 (or components thereof) to communicate with external sources, such as a utility company central office (e.g., the central office 118), a mobile wireless meter reading device, a consumer, a user, or the like. The communication component 108 may be configured to format data, such as into frames or data packets associated with one or more communications protocols that facilitate one-way and/or two-way communication with entities external to the meter device 102. As an example, the communication component 108 may include a radio frequency (RF) transmitter, receiver and/or transceiver (not shown) to facilitate wireless communications, a power line communications (PLC) transceiver (not shown) for communication via a power line, a direct communication interface, etc.

In some examples, the communication component 108 can transmit the alarm signal over one or more networks to the alarm device 120 to notify customer(s) at the location 110 of the potential electrical threat. The one or more networks may be the network(s) 116, or another local network. For instance, the communication component 108 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.) or any suitable current or future wired or wireless communications protocol that enables the meter device 102 to interface with the other computing device(s). In some examples, the alarm signal may also indicate which load within the location 110 is experiencing the potential electrical threat due to the loose wire connection. The alarm device 120 can represent, for example, an application of a computing device associated with the customer, a fire alarm, and so on. The alarm signal generated by the behavior component 106 may also or instead be transmitted by the communication component 108 to an emergency service such as the fire department.

In some examples, the communication component 108 can receive a firmware update that installs an algorithm, a threshold value, or other data usable by the meter device 102.

The network(s) 116 may represent various networks including public and/or proprietary utility company networks, the internet, a wired network, a wireless network, an optical network, and/or other network types.

Figure 2:
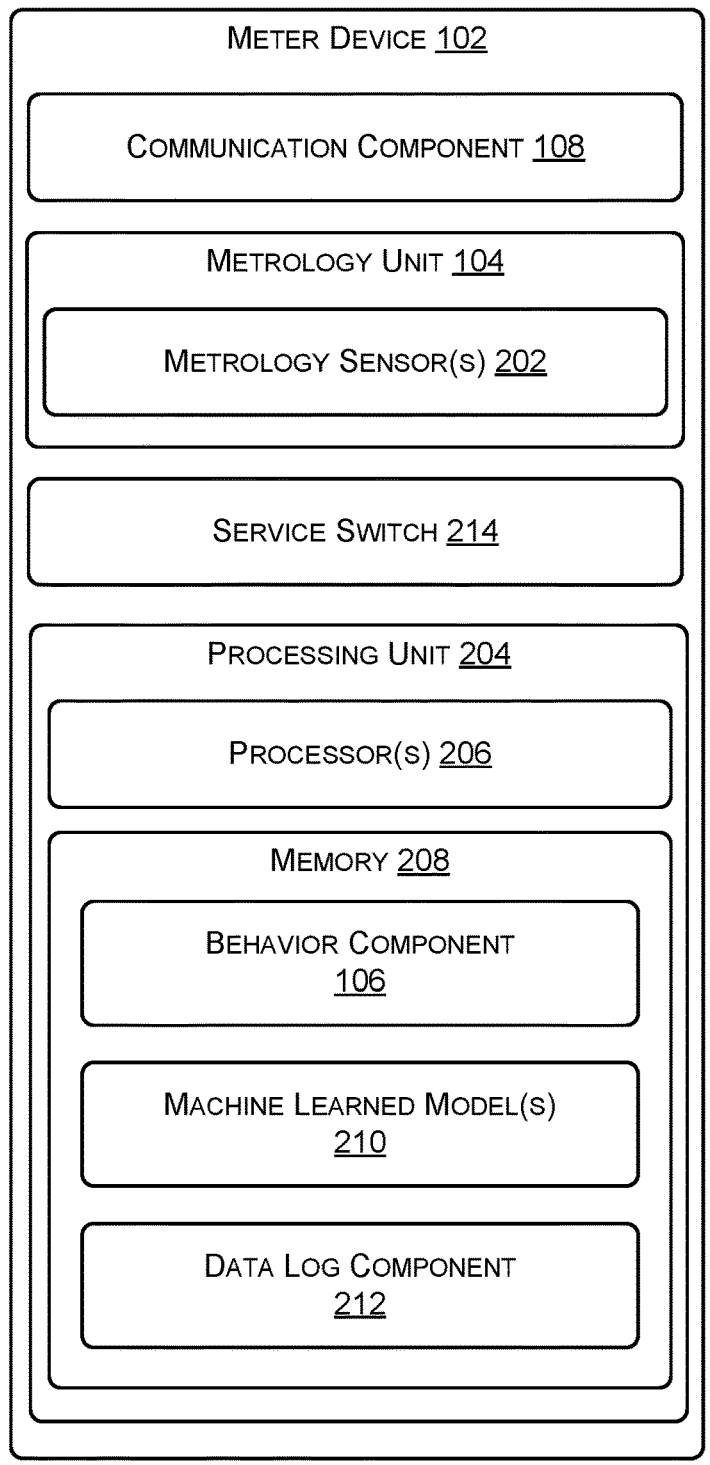
FIG. 2 is a block diagram showing more detail of an example meter device for implementing the techniques described herein.

FIG. 2 is a block diagram showing more detail of an example meter device 200 for implementing the techniques described herein. As shown in FIG. 2, the meter device 102 includes the communication component 108, the metrology unit 104 that includes one or more metrology sensor(s) 202, and a processing unit 204 that includes one or more processor(s) 206 and one or more memor(ies) (shown as memory 208). The memory 208 includes the behavior component 106, a machine learned model(s) 210, and a data log component 212. FIG. 2 also shows the meter device 102 including a service switch 214.

The metrology sensor(s) 202 can include one or more of electrical sensors including but not limited to: a resistance sensor, an inductive sensor, a capacitance sensor, a voltage sensor, and/or a power sensor to measure corresponding electrical consumption at the location 110. The metrology sensor(s) 202 is coupled to processing unit 204. The processing unit 204 may provide functionality of a clock, for tracking time of day, and various timing and measuring tasks associated with the electrical data 112. In some examples, the processing unit 204 represents an application-specific integrated circuit (ASIC), field programmable gate array (FPGA), general purpose microprocessor, microcontroller, system or PC on a chip/card, or other suitable hardware logic. The memory 208 may comprise computer-readable storage media that includes, but is not limited to, RAM, ROM, EEPROM, flash memory, cache memory, or other hardware storage devices or hardware-based memory technology.

The behavior component 106 is configured to receive data from the one or more metrology sensor(s) 202 and process the data to detect potential electrical threats associated with one or more loads within the location 110. In some examples, the behavior component 106 can implement the machine learned model(s) 210 that is configured to compare patterns of electrical usage over time one to another, and recognize a pattern of electrical usage that represents a potential electrical threat (e.g., a loose wire that may cause a fire). The machine learned model(s) 210 can be trained based on training data that indicates which electrical usage patterns are associated with potential electrical threats. Thus, the machine learned model(s) 210 can, in some examples, compare a pattern of electrical usage over a time period (e.g., electrical data received from the metrology unit) to a pattern that is associated with a potential electrical threat (e.g., labeled data), and based on the comparison determine that the pattern of electrical usage represents an electrical threat. In various examples, machine learned model(s) 210 can implement load disaggregation and/or pattern matching techniques to determine the potential electrical threat. Additionally or alternatively, the machine learned model(s) 210 can implement an algorithm that detects abnormal electrical activity for a load or a combination of loads over time. For example, the algorithm can identify a change in an amount of electrical activity (e.g., voltage, current, power, frequency, etc.) between a first time period and a second time period, and determine whether the amount of change is within a threshold amount of change (independent of comparing a pattern of electrical usage to labeled data associated with an electrical threat).

In some examples, the behavior component 106 can receive electrical usage information for a first period of time and determine whether a pattern that represents an electrical threat is present. For example, the behavior component 106 can implement an algorithm that generates a pattern, or a shape, to represent the electrical usage information. Alternatively, a different algorithm can be implemented by the behavior component 106 to identify whether abnormal electrical values are present in the electrical usage information. In such examples, the behavior component 106 can determine whether to receive additional electrical usage information for one or more additional periods of time to verify, confirm, or otherwise determine that an alarm signal is to be generated to communicate the potential electrical threat to a consumer and/or to a utility provider. For instance, the behavior component 106 can receive first electrical data representing first electrical usage over a first time period, determine that a potential electrical threat exists, and request second electrical data representing the second electrical usage over a second time period from the metrology unit 104. By comparing the first electrical data to the second electrical data or by implementing an algorithm to analyze the first electrical data and the second electrical data for abnormal electrical values, the behavior component 106 can determine whether the first electrical usage and/or the second electrical usage is associated with the potential electrical threat.

In some instances, the behavior component 106 can receive additional electrical data prior to determining that the potential electrical threat exists. By way of example and not limitation, the behavior component 106 can monitor electrical behavior each second (e.g., the first time period), continue monitoring additional electrical behavior for 10 seconds (e.g., the second time period), and further monitor electrical behavior for an additional 30 seconds (e.g., the third time period), and determine a likelihood of an electrical threat after each time period. The behavior component 106 can, for example, generate an alarm signal after any one of the aforementioned time periods. Though the above example illustrates particular time frames such as 1 second, 10 seconds, 30 seconds, any amount of time may be associated with each time period and more or fewer time periods may be included prior to an electrical threat determination by the behavior component 106.

As mentioned, the behavior component 106 can compare electrical data associated with different periods of time. In some examples, comparisons by the behavior component 106 can include determining a difference between respective electrical data that is associated with different periods of time. Additionally or alternatively, comparisons by the behavior component 106 can include comparing patterns represented by the respective electrical data. In various examples, patterns associated with electrical data may be compared one to another to identify whether a load is no longer operating safely (e.g., has a potential for spark or fire). The behavior component 106 can thereby determine change(s) in electrical behavior for a particular location based at least in part on electrical characteristics specific for the location. In some examples, a change in electrical behavior from a first time period to a second time period can be identified based on the machine learned model(s) 210 comparing a pattern of electrical data associated with a time period to a pattern known to represent an electrical threat (e.g., ground truth).

The machine learned model(s) 210 can be trained to identify an electrical threat based on historical electrical data associated with a particular location. In this way, the meter device 102 can make electrical threat determinations based on electrical behavior at each specific location.

In some examples, the behavior component 106 can implement an algorithm (a mathematical algorithm and/or a machine learned algorithm) that determines an average variance value between the electrical data of a time period and data known to exhibit "normal" electrical behavior. For instance, the algorithm may determine the average variance value of a number of electrical readings (e.g., 3 reading, 10 reading, and so on) associated with metrology data received from the metrology unit 104 and compare the average variance value to a threshold value. In such examples when the average variance value is equal to or exceeds the threshold value, the behavior component 106 can generate an alarm signal whereas when the average variance value is less than the threshold value no alarm signal is generated. The behavior component 106 can adjust the threshold value indicative of normal electrical behavior as the behavior component continues to monitor electrical usage (e.g., such as by setting the threshold value based on stepwise changes in electrical quantities). To illustrate, a load such as an appliance that is turned on and off regularly, will exhibit electrical behavior and the threshold value can be set to represent voltage, current, power, or other values used by the appliance. In this way, the behavior component 106 can identify abnormal electrical behavior different from the load being turned on and off such as when the load has a loose connection to electrical power supply. By comparing the average variance value to a dynamic threshold value that changes with time, the behavior component 106 can "learn" to identify potential electrical threats.

The behavior component 106 can, in various examples, monitor changes in electrical behavior based at least in part on interactively comparing respective average variance values to a threshold value. For example, the behavior component 106 may receive real-time data (e.g., electrical data received from the metrology unit 104 each second or other timeframe), analyze the data and determine a potential electrical threat (e.g., an initial determination). In some examples, the behavior component 106 may analyze the data based on a machine learning decision tree, or other algorithm, that determines a potential spark associated with a loose connection exists. Responsive to determining the potential electrical threat, a same or different algorithm can be implemented by the behavior component 106 to verify the initial determination. For instance, the behavior component 106 can receive a number of electrical readings representing electrical usage at different times, identify an average variance value associated with the number of electrical readings, and compare the average variance value to the threshold value. By way of example and not limitation, an average variance value may be determined for an additional 3 readings (or other number) of electrical data, and based on a comparison of the average variance value to threshold value, an electrical threat determination can be made (the initial determination can be verified). The behavior component 106 may iteratively compare further average variance values of an additional number of readings to the threshold value to verify whether the electrical threat still exists (e.g., to differentiate between a temporary arc and a continuous loose connection). In some examples, the behavior component 106 can make a determination of the potential electrical threat after an additional 10 readings of electrical data followed by an additional 30 readings of electrical data, though any number of electrical readings may be used.

In some examples, an alarm signal may be generated by the behavior component 106 based on the real-time analysis of the data that indicates a loose connection exists while in other examples the alarm signal may be generated after iteratively comparing respective average variance values to the threshold value.

In some examples, the behavior component 106 can cause power to be disconnected at a location experiencing a potential electrical threat. For example, instead of or in addition to an alarm signal being generated, the behavior component 106 can generate a signal that results in disconnecting power to the location 110. In some examples the power may be disconnected directly by the meter device 102 while in other examples the power may be disconnected based on a signal being communicated and/or transmitted from the meter device 102 to the central office 118. Additional details of functionality provided by the behavior component 106 are discussed in relation to FIGS. 3-5, and elsewhere.

In some examples, the behavior component 106 can escalate reporting of an electrical threat by first notifying a customer. (e.g., by sending an alarm signal to an application of the computing device), reporting the electrical threat to the central office 118 associated with the utility provider, notifying emergency services of the potential electrical threat (e.g., the fire department), and/or disconnecting power to the location 110, just to name a few. The escalated reporting may be responsive to iterative monitoring which indicates, verifies, or otherwise determines that the electrical threat continues over time.

The data log component 212 is configured to log or store the electrical data 112 and/or the data indicating a potential electrical threat 114 (e.g., including pattern(s) associated with the data) in a database, memory, or other storage location. Implementing the data log component 212 enables data to be available for processing by the behavior component 106 (e.g., determining a potential electrical threat, determine a threshold value, update a threshold value, add node(s) to a decision tree, and so on) and/or to be available for training the machine learned model(s) 210. In some examples, the data log component 212 can associate timestamps with stored data to indicate a time period for the stored data. In some instances, the data log component 212 can store and label data representing raw electrical data, pattern data, threshold data, potential electrical threat data, etc. For example, stored pattern data may be associated with a label indicating a "normal" electrical pattern or an "abnormal" electrical pattern.

As shown in FIG. 2, the meter device 102 includes the service switch 214 that is configured to connect and/or disconnect power to the location 110 associated with the meter device 102. For instance, the service switch 214 can disconnect power to the one or more loads of the location 110 responsive to determining that a potential electrical threat exists and reconnect the one or more loads responsive to determining that it is safe to provide power to the location (e.g., the potential electrical threat no longer exists).

While shown in FIG. 2 as a single block, processing unit 204 may be implemented as one or more separate devices and is communicatively coupled to the memory 208. While shown as separate blocks, the metrology unit 104, the communication component 108, the processing unit 204, and/or the memory 208 may be implemented as a single device or as multiple devices.

Figure 3:
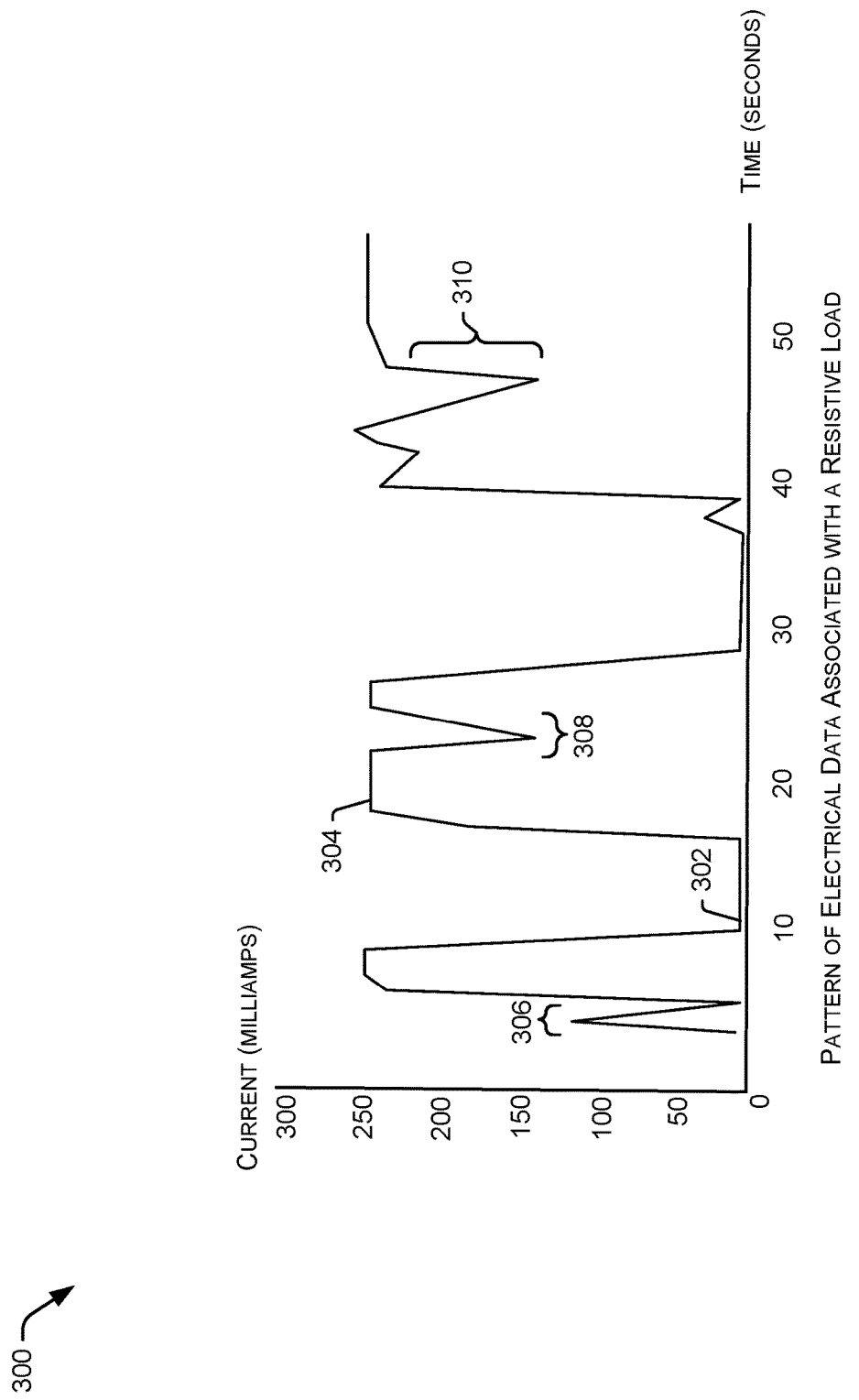
FIG. 3 is an example illustration of example patterns of electrical usage that an example meter device can analyze to determine a potential electrical threat.

FIG. 3 is an example illustration 300 of example patterns of electrical usage that an example meter device (meter device 102) can analyze to determine a potential electrical threat. For instance, the patterns shown in FIG. 3 can represent current used by an appliance over time, though other load types are also contemplated. While FIG. 3 represents patterns of electrical data associated with a resistive load, other patterns may be determined for electrical data associated with other load types (e.g., a capacitance load of a dimmer switch, and the like).

At 302, a very small amount of current (e.g., several milliamps) can represent an "off" state of the appliance whereas at 304 a larger amount of current can represent an "on" state. The meter device 102 can identify, detect, and/or otherwise determine a potential electrical threat associated with the load (e.g., a loose wire connection to the appliance) based at least in part on a pattern 306, a pattern 308, and/or a pattern 310. For instance, the pattern 306 can represent a surge in current while in an "off" state that may be caused by a loose connection between the appliance and a power supply that provides power to the appliance. The pattern 308 and the pattern 310 can represent a change in current while the load is in an "on" state caused by a loose wire intermittently losing connection between the load and the power supply.

In various examples, the meter device 102 can implement the behavior component 106 and/or the machine learned model(s) 210 to determine that the pattern 306, the pattern 308, and the pattern 310 represent potential electrical threats associated with a load. For example, the behavior component 106 can implement one or more algorithms to mathematically compare values associated with electrical data received from the metrology unit 104 over time (e.g., compare power values, resistance values, capacitance values, and so on when a load changes between an on and off state, or when it maintains a state between the on and off states). Further, the machine learned model(s) 210 can employ a machine learned decision tree or other algorithm that identifies whether a pattern is associated with an electrical threat.

Example Electrical Threat Determination Methods

Figure 4A:
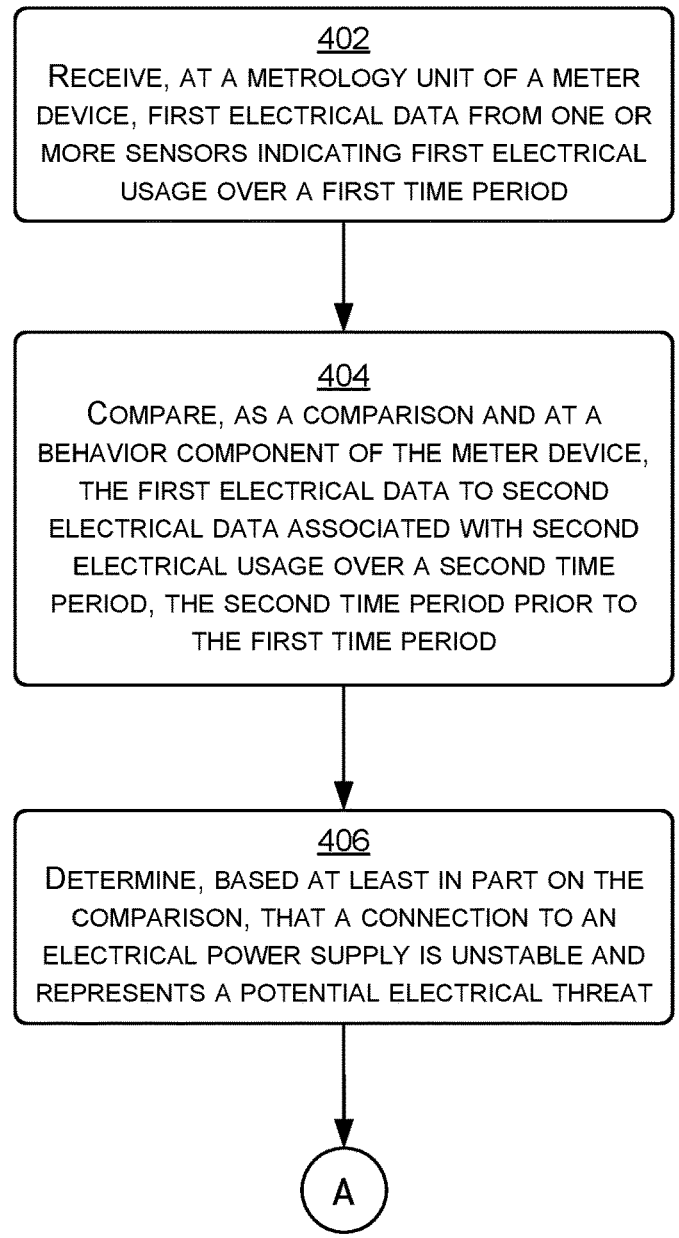
FIG. 4A is a first part of a flowchart depicting an example process for determining a potential electrical threat using one or more example components of a meter device.
Figure 4B:
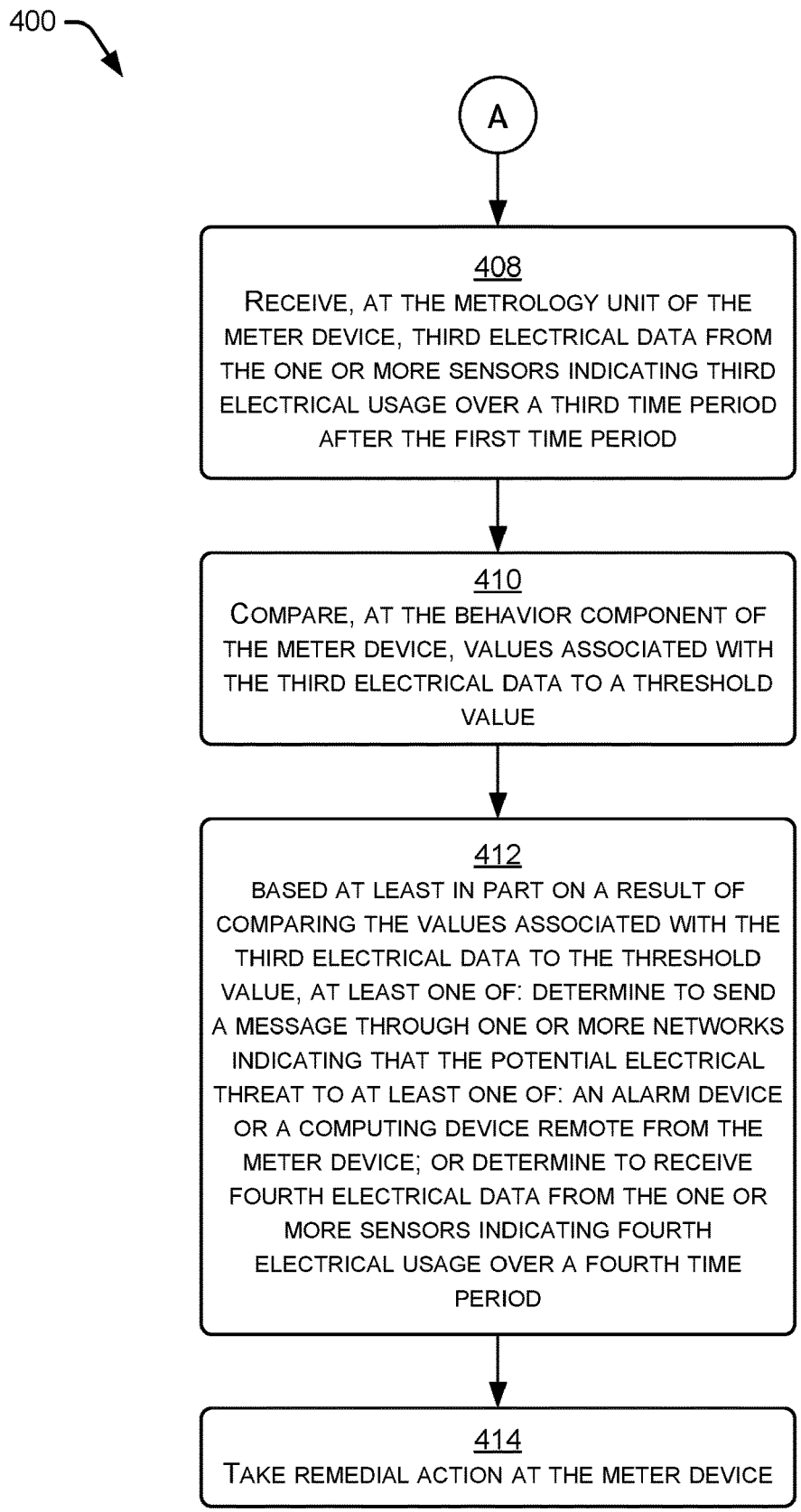
FIG. 4B is a second part of the flowchart depicting the example process for determining a potential electrical threat using one or more example components of a meter device.
Figure 5:
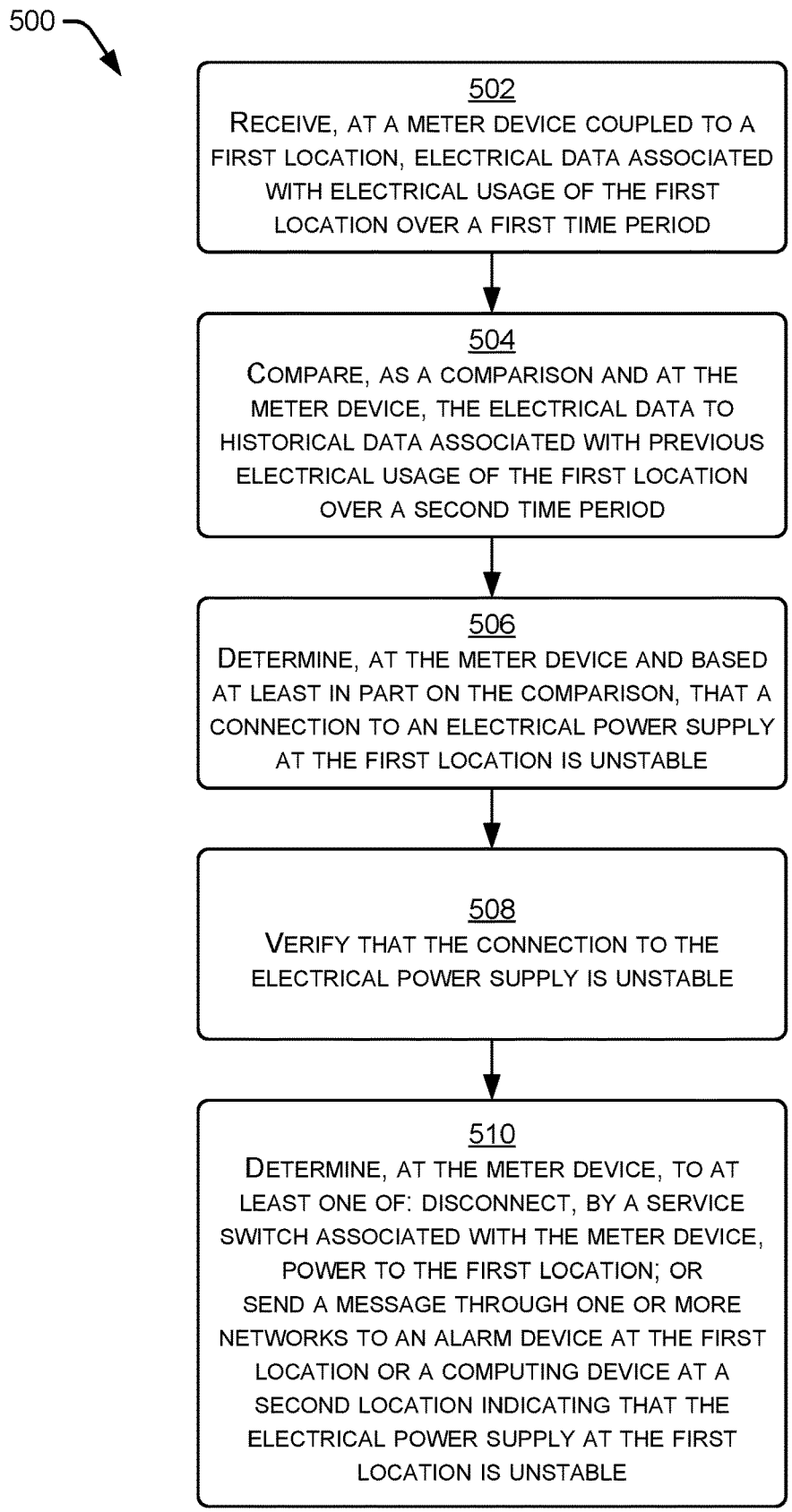
FIG. 5 is another flowchart depicting another example process for determining a potential electrical threat using one or more example components of a meter device.

FIGS. 4A, 4B, and 5 are flow diagrams showing example processes 400-500 which are representative of techniques for use in a meter device to detect and report electrical threats. The processes may, but need not necessarily, be implemented in whole or in part by or within the environment 100 and/or the meter devices of FIGS. 1 through 3. In the examples and techniques discussed herein, the methods of operation may be performed by one or more application specific integrated circuits (ASICs) or may be performed by a general-purpose processor utilizing software defined in computer readable media. In the examples and techniques discussed herein, the memory 208 may comprise computer-readable media and may take the form of volatile memory, such as random access memory (RAM) and/or non-volatile memory, such as read only memory (ROM) or flash RAM. Computer-readable media devices include volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device. The various algorithms, machine learned models, logical expressions, functions, steps, and/or operations of the processes described herein may be encoded in computer-readable instructions, data structures, program modules, and/or other data to implement the various techniques described herein.

As defined herein, computer-readable media includes non-transitory computer-readable media as well as transitory media, such as modulated data signals and carrier waves, and/or signals.

FIG. 4A is a first part of a flowchart depicting an example process 400 for determining a potential electrical threat using one or more example components of a meter device.

At operation 402, the process 400 may include receiving, at a metrology unit of a meter device, first electrical data from one or more sensors indicating first electrical usage over a first time period. In some examples, the operation 402 may include the metrology unit 104 of the meter device 102 receiving the electrical data 112 associated with the location 110 (e.g., a residence, a business, etc.). The electrical data may be received from one or more sensors that measure resistance, capacitance, voltage, power, or other electrical characteristics associated with a resistive load, a capacitive load, or other load type. Electrical data may also or instead be associated with a frequency domain. The electrical data may be associated with a particular load within the location having multiple loads that consume power to operate.

At operation 404, the process 400 may include comparing, as a comparison and at a behavior component of the meter device, the first electrical data to second electrical data associated with second electrical usage over a second time period, the second time period prior to the first time period. In some examples, the operation 404 may include the behavior component 106 of the meter device 102 comparing the electrical data 112 to historical electrical data. The behavior component 106 for example may employ mathematical algorithm(s), statistical analysis, and/or machine learning technique(s) to compare the first electrical data and the second electrical data. For instance, the behavior component 106 may implement a machine learned decision tree and/or a machine learned algorithm to identify differences in a pattern of the first electrical data and a pattern of the second electrical data.

At operation 406, the process 400 may include determining, based at least in part on the comparison, that a connection to an electrical power supply is unstable and represents a potential electrical threat. In some examples, the operation 406 may include the behavior component 106 outputting data indicating a potential electrical threat 114 based at least in part on the comparison. For instance, the behavior component 106 can determine that a pattern in the electrical data 112 differs from the "normal" pattern of electrical usage for a load that is securely connected to a power supply. By comparing the electrical usage gathered over different periods of time, the behavior component 106 can determine whether a connection between a load at a power supply within the location 110 is loose or otherwise unstable (e.g., changes between being fully connected, partially connected, or disconnected).

FIG. 4B is a second part of a flowchart depicting the example process 400 for determining a potential electrical threat using one or more example components of a meter device.

At operation 408, the process 400 may include receiving, at the metrology unit of the meter device, third electrical data from the one or more sensors indicating third electrical usage over a third time period after the first time period. In some examples, the operation 408 may include the behavior component 106 receiving additional electrical data from the metrology unit 104 to verify the potential electrical threat associated with previously received electrical data.

At operation 410, the process 400 may include comparing, at the behavior component of the meter device, values associated with the third electrical data to a threshold value. In some examples, the operation 410 may include the behavior component 106 comparing electrical data values to a threshold value representing electrical values that are free of an electrical threat. In some examples, the threshold value may be determined dynamically by the behavior component 106 over time based on previously gathered electrical data such that the threshold value is specific for a particular load and/or a particular location.

At operation 412, the process 400 may include at least one of: determining to send a message through one or more networks indicating that the potential electrical threat to at least one of: an alarm device or a computing device remote from the meter device; or determining to receive fourth electrical data from the one or more sensors indicating fourth electrical usage over a fourth time period. In some examples, the operation 412 may include the behavior component 106 determining that the electrical data values meet or exceed the threshold value which causes the communication component 108 to generate an alarm signal indicating the potential electrical threat. In other examples the behavior component 106 may determine that the electrical data values are less than the threshold value in which case no alarm signal is generated. In examples when the behavior component 106 determines to generate an alarm signal, the communication component 108 can send a message via one or more networks to report the potential electrical threat to an alarm device of the customer and/or a computing device remote from the meter device 102 (e.g., the central office 118). In some examples the alarm device may be located at the location 110, and the alarm signal can be received independent of utilizing the network(s) 116 (e.g., without reporting the potential electrical threat to the central office 118). In examples when the behavior component 106 determines that the electrical data values are less than the threshold value, the behavior component 106 can continue to monitor electrical usage at the location by receiving further electrical data for an additional time.

At operation 414, the process 400 may include taking a remedial action at the meter device. In some examples, the operation 414 may include the service switch 214 of the meter device 102 disconnecting power to the location 110 to prevent a possible fire or other electrical threat. The operation 414 may also include sending an indication of the power being disconnected to a computing device remote from the meter device 102 (e.g., the central office 118).

FIG. 5 is another flowchart depicting another example process 500 for determining a potential electrical threat using one or more example components of a meter device.

At operation 502, the process 500 may include receiving, at a meter device coupled to a first location, electrical data associated with electrical usage of the first location over a first time period. In some examples, the operation 502 may include the meter device 102 receiving the electrical data 112 associated with the location 110. For instance, the electrical data 112 can represent power used by a single load or multiple loads within the location 110. In one specific example, the first time period may be one second while in other examples the first time period can be greater than or less than one second.

At operation 504, the process 500 may include comparing, as a comparison and at the meter device, the electrical data to historical data associated with previous electrical usage of the first location over a second time period. In some examples, the operation 504 may include the meter device comparing the electrical data to previously collected electrical data. The meter device 102 may, for example, implement the behavior component 106 to identify differences in electrical values, frequencies, patterns or other differences in electrical usage between the two time periods.

At operation 506, the process 500 may include determining, at the meter device and based at least in part on the comparison, that a connection to an electrical power supply at the first location is unstable. In some examples, the operation 506 may include the meter device 102 identifying a loose connection between a load at the location and power supply that is not properly secured (e.g., intermittently changes between an on state and off state) and represents a potential fire risk due to a spark or other electrical event associated with the loose connection.

At operation 508, the process 500 may include verifying that the connection to the electrical power supply is unstable. In some examples, the operation 508 may include comparing, as a second comparison, second electrical data over a third time period to the first electrical data. For instance, one or more additional comparisons of additional electrical data associated with different time periods can be compared to previously received electrical data. Additionally or alternatively, verifying that the connection to the electrical power supply is unstable can comprise sending the electrical data associated with different time period(s) to a remote computing device (e.g., the central office 118) and receiving, from the remote computing device, a confirmation that the connection to the electrical power supply is unstable. In such examples, the remote computing device may implement more sophisticated/powerful algorithms (than those implemented by the meter device 102) and/or utilize more information about the grid (e.g., power surges, voltage fluctuations, data from other nearby meters and/or transformers, etc.) to either confirm or override the meter's determination.

At operation 510, the process 500 may include determining, at the meter device, to at least one of: disconnect, by a service switch associated with the meter device, power to the first location; or send a message through one or more networks to an alarm device at the first location or a computing device at a second location indicating that the electrical power supply at the first location is unstable. In some examples, the operation 510 may include the meter device 102 determining to send a message indicating that at least one electrical power supply at the first location is not securely connected to a load. For instance, the meter device 102 may implement the communication component 108 to transmit a message over one or more networks to alarm device associated with a customer at the first location or a computing device associated with a utility provider. By using the meter device 102 to send a message to alarm device at the first location, notification of a potential electrical threat can be made sooner and with more accuracy versus not detecting the potential electrical threat at the meter device 102. In other examples, the operation 510 may include the service switch 214 at the meter device 102 disconnecting power to the first location.

The methods described herein represent sequences of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes. In some embodiments, one or more operations of the method may be omitted entirely. Moreover, the methods described herein can be combined in whole or in part with each other or with other methods.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:
1. A method, comprising:
receiving, at a metrology unit of a meter device, first electrical data from one or more sensors indicating first electrical usage over a first time period, the first electrical data comprising frequency domain data;
comparing, as a comparison and at a behavior component of the meter device, the first electrical data to second electrical data associated with second electrical usage over a second time period, the second time period prior to the first time period;

determining, based at least in part on the comparison, that a connection to an electrical power supply is unstable and represents a potential electrical threat;

receiving, at the metrology unit of the meter device, third electrical data from the one or more sensors indicating third electrical usage over a third time period after the first time period;

comparing, at the behavior component of the meter device, values associated with the third electrical data to a threshold value utilizing a first algorithm of multiple algorithms;

based at least in part on a result of comparing the values associated with the third electrical data to the threshold value, sending a message, indicating the potential electrical threat and including data associated with the result, through one or more networks to a computing device remote from the meter device;

receiving, by the meter device from the computing device, a confirmation of the potential electrical threat, the confirmation determined by the computing device, based on the data associated with the result and additional electrical data from one or more meter devices different from the meter device, utilizing a second algorithm of the multiple algorithms, the second algorithm different from the first algorithm; and in response to receiving the confirmation, disconnecting, by a service switch associated with the meter device, the connection to the electrical power supply.

2. The method of claim 1, wherein:
the comparison indicates a difference between the first electrical data associated with the first electrical usage and the second electrical data associated with the second electrical usage, and determining the difference is based at least in part on an output from a machine learned model.

3. The method of claim 1, wherein the third electrical data comprises electrical usage readings, and further comprising:
comparing an average variance of the electrical usage readings during the third time period to the threshold value; and at least one of:
determining to send the message indicating the potential electrical threat based at least in part on the average variance of the electrical usage readings being greater than or equal to the threshold value; or
determining to not send the message indicating the potential electrical threat based at least in part on the average variance of the electrical usage readings being less than or equal to the threshold value.

4. The method of claim 3, wherein the electrical usage readings are first electrical usage readings and the average variance is a first average variance, and further comprising:
monitoring the potential electrical threat for a fourth time period after the third time period, the monitoring including determining an average variance of second electrical usage readings during the fourth time period;

comparing a second average variance of the second electrical usage readings during the fourth time period to the threshold value; and at least one of:
determining to send the message indicating the potential electrical threat based at least in part on the average variance of the second electrical usage readings being greater than or equal to the threshold value; or
determining to not send the message indicating the potential electrical threat based at least in part on the average variance of the second electrical usage readings being less than the threshold value.

5. The method of claim 1, wherein determining that the connection to the electrical power supply is unstable comprises:
inputting the first electrical data to a machine learned model that is trained based at least in part on the second electrical data, and receiving an output from the machine learned model indicating that the connection is unstable.

6. The method of claim 1, wherein:
the first electrical data further comprises resistive data, current data, capacitance data, voltage data, or power data;

the first electrical usage is associated with a resistive load, an inductive load, or a capacitive load; and the connection to the electrical power supply comprises a loose connection that is connected to the electrical power supply intermittently over the first time period.

7. One or more non-transitory computer-readable media storing instructions executable by one or more processors, wherein the instructions, when executed, cause the one or more processors to perform operations comprising:
receiving, at a meter device coupled to a first location, electrical data associated with electrical usage of the first location over a first time period, the electrical data comprising frequency domain data;

comparing, as a comparison and at the meter device utilizing a first algorithm of multiple algorithms, the electrical data to historical data associated with previous electrical usage of the first location over a second time period;

determining, at the meter device and based at least in part on the comparison, that a connection to an electrical power supply at the first location is unstable;

verifying that the connection to the electrical power supply is unstable by:
sending, by the meter device, a message, including the electrical data and indicating that the electrical power supply at the first location is unstable, through one or more networks to a remote computing device at a second location, and receiving, by the meter device from the remote computing device, a confirmation that the electrical power supply at the first location is unstable, the confirmation determined by the remote computing device, based on the electrical data and additional electrical data from one or more meter devices different from the meter device, utilizing a second algorithm of the multiple algorithms, the second algorithm different from the first algorithm; and in response to receiving the confirmation, disconnecting, by a service switch associated with the meter device, power to the first location.

8. The one or more non-transitory computer-readable media of claim 7, wherein the comparison is a first comparison, the electrical data is first electrical data, and verifying that the connection to the electrical power supply is unstable comprises comparing, as a second comparison, second electrical data over a third time period to the first electrical data.

9. The one or more non-transitory computer-readable media of claim 8, wherein the connection represents a potential electrical threat, the electrical data comprises first electrical data, and the operations further comprising:
  monitoring the potential electrical threat for a third time period, the monitoring including determining an average variance of readings of second electrical data during the third time period;
  comparing the average variance of readings of the second electrical data during the third time period to a threshold value; and
  at least one of:
    determining to send the message indicating the potential electrical threat based at least in part on the average variance being greater than or equal to the threshold value; or
    determining to not send the message indicating the potential electrical threat based at least in part on the average variance being less than the threshold value.

10. The one or more non-transitory computer-readable media of claim 9, wherein the average variance is a first average variance, and the operations further comprising:
  monitoring the potential electrical threat for a fourth time period after the third time period, the monitoring determining a second average variance of third electrical usage readings during the fourth time period;
  comparing the average variance of the third electrical usage readings during the fourth time period to the threshold value; and
  at least one of:
    determining to send the message indicating the potential electrical threat based at least in part on the second average variance of the third electrical usage readings being greater than or equal to the threshold value; or
    determining to not send the message indicating the potential electrical threat based at least in part on the second average variance of the third electrical usage readings being less than or equal to the threshold value.

11. The one or more non-transitory computer-readable media of claim 7, wherein the second time period is prior to the first time period, and determining that the connection to the electrical power supply is unstable comprises:
  inputting the electrical data to a machine learned model that is trained based at least in part on the historical data, and
  receiving an output from the machine learned model indicating that the connection is unstable.

12. The one or more non-transitory computer-readable media of claim 7, wherein:
  the connection to the electrical power supply at the first location comprises a loose connection that is connected to the electrical power supply intermittently over the first time period.

13. The one or more non-transitory computer-readable media of claim 7, wherein:
  the first location receives electrical service from a utility service provider remote from the first location; and
  the remote computing device at the second location represents a headend device associated with the utility service provider.

14. The one or more non-transitory computer-readable media of claim 7, the operations further comprising:
  determining that the connection to the electrical power supply is associated with a load having an insecure connection to the electrical power supply;
  identifying an area within the first location at which the load has the insecure connection; and
  sending the message indicating that the electrical power supply at the first location is not secure comprises sending an alarm signal indicating the area within the first location at which the load is not secure.

15. The one or more non-transitory computer-readable media of claim 14, further comprising:
  inputting the electrical data into a machine learned model associated with the meter device;
  receiving an output from the machine learned model indicating load disaggregation or pattern matching for the load; and
  identifying the area within the first location at which the load has the insecure connection based at least in part on the output from the machine learned model.

16. A meter device, comprising:
an electrical sensor;
one or more processors; and
one or more non-transitory computer-readable media storing instructions executable by the one or more processors, wherein the instructions, when executed, cause the meter device to perform operations comprising:
  receiving, at a meter device coupled to a first location, electrical data associated with electrical usage of the first location over a first time period, the electrical data comprising frequency domain data;
  comparing, as a comparison and at the meter device utilizing a first algorithm of multiple algorithms, the electrical data to historical data associated with previous electrical usage of the first location over a second time period;
  determining, at the meter device and based at least in part on the comparison, that a connection to an electrical power supply at the first location is unstable;
  verifying that the connection to the electrical power supply is unstable by:
    sending, by the meter device, a message, including the electrical data and indicating that the electrical power supply at the first location is unstable, through one or more networks to a remote computing device, and
    receiving, by the meter device from the remote computing device, a confirmation that the electrical power supply at the first location is unstable, the confirmation determined by the remote computing device, based on data associated with the comparison and additional electrical data from one or more meter devices different from the meter device, utilizing a second algorithm of the multiple algorithms, the second algorithm different from the first algorithm; and
  in response to receiving the confirmation, disconnecting, by a service switch associated with the meter device, power to the first location.

17. The meter device as recited in claim 16, wherein the second time period is prior to the first time period, and determining that the connection to the electrical power supply is unstable comprises:
  inputting the electrical data to a machine learned model that is trained based at least in part on the historical data, and
  receiving an output from the machine learned model indicating that the connection is unstable.

18. The meter device as recited in claim 16, wherein:
the connection to the electrical power supply at the first location comprises a loose connection that is connected to the electrical power supply intermittently over the first time period.

\* \* \* \* \*